United States Patent
Hidaka et al.

(10) Patent No.: US 9,029,453 B2
(45) Date of Patent: May 12, 2015

(54) POLYVINYLIDENE FLUORIDE RESIN COMPOSITION, WHITE RESIN FILM, AND BACKSHEET FOR SOLAR CELL MODULE

(75) Inventors: Tomoyuki Hidaka, Tokyo (JP); Kazuyuki Suzuki, Tokyo (JP); Mitsunori Aita, Tokyo (JP); Hiroshi Sakabe, Tokyo (JP)

(73) Assignee: Kureha Corporation, Tokyo (JP)

( * ) Notice: Subject to any disclaimer, the term of this patent is extended or adjusted under 35 U.S.C. 154(b) by 694 days.

(21) Appl. No.: 13/265,182

(22) PCT Filed: Apr. 14, 2010

(86) PCT No.: PCT/JP2010/056705
§ 371 (c)(1), (2), (4) Date: Oct. 19, 2011

(87) PCT Pub. No.: WO2010/122936
PCT Pub. Date: Oct. 28, 2010

(65) Prior Publication Data
US 2012/0041122 A1  Feb. 16, 2012

(30) Foreign Application Priority Data
Apr. 20, 2009 (JP) ................................ 2009-102302

(51) Int. Cl.
| | | |
|---|---|---|
| C08K 5/15 | (2006.01) | |
| H01L 31/048 | (2014.01) | |
| C08J 5/18 | (2006.01) | |
| C08K 3/22 | (2006.01) | |
| C08K 5/098 | (2006.01) | |
| C08L 27/16 | (2006.01) | |
| C08F 14/22 | (2006.01) | |
| C08K 5/00 | (2006.01) | |
| H01L 31/049 | (2014.01) | |
| C08K 3/26 | (2006.01) | |
| C08K 13/02 | (2006.01) | |

(52) U.S. Cl.
CPC ................ *H01L 31/048* (2013.01); *C08J 5/18* (2013.01); *C08K 3/22* (2013.01); *C08K 5/098* (2013.01); *C08L 27/16* (2013.01); *C08F 14/22* (2013.01); *C08K 5/005* (2013.01); *H01L 31/049* (2014.12); *H01L 31/0481* (2013.01); *C08J 2327/16* (2013.01); *C08J 2433/12* (2013.01); *C08K 3/26* (2013.01); *C08K 5/0008* (2013.01); *C08K 13/02* (2013.01); *Y02E 10/50* (2013.01); *C08K 2003/2237* (2013.01)

(58) Field of Classification Search
CPC ............ C08J 5/18; C08K 3/22; C08K 5/098; C08K 5/005; C08L 27/16; C08F 14/22; H01L 31/049; H01L 31/048; H01L 31/0481

USPC ................................................ 524/400, 381
See application file for complete search history.

(56) References Cited

U.S. PATENT DOCUMENTS

| | | | |
|---|---|---|---|
| 4,692,381 A | 9/1987 | Pecsok | |
| 6,197,220 B1 | 3/2001 | Blok et al. | |
| 6,777,610 B2 * | 8/2004 | Yamada et al. | 136/251 |
| 6,919,392 B1 * | 7/2005 | Chenard et al. | 524/180 |
| 2009/0035642 A1 | 2/2009 | Hatsuda | |
| 2009/0252940 A1 | 10/2009 | Gouda et al. | |
| 2009/0275251 A1 | 11/2009 | Bonnet et al. | |
| 2010/0000601 A1 | 1/2010 | Burchill | |
| 2010/0175742 A1 | 7/2010 | Burchill et al. | |

FOREIGN PATENT DOCUMENTS

| | | |
|---|---|---|
| EP | 0942038 A1 | 9/1999 |
| EP | 1938967 A | 7/2008 |
| EP | 2031613 A2 | 3/2009 |
| JP | 49-33942 A | 3/1974 |
| JP | 61-275344 A | 12/1986 |
| JP | 6-316663 A | 11/1994 |
| JP | 11-207887 A | 8/1999 |
| JP | 2002-100788 A | 4/2002 |
| JP | 2007-035694 A | 2/2007 |
| JP | 2007-208179 A | 8/2007 |
| JP | 2009-071236 A | 4/2009 |
| WO | 02/072686 A2 | 9/2002 |
| WO | 02/073638 A1 | 9/2002 |
| WO | 2007-085769 A2 | 8/2007 |
| WO | 2008-019229 A2 | 2/2008 |
| WO | 2008-157159 A1 | 12/2008 |

OTHER PUBLICATIONS

Second Office Action from corresponding Chinese Application CN 101410249 dated Nov. 15, 2013.
Chemical Aids for Polymer Materials, Chemical Industry Publisher, p. 277 and p. 290, Aug. 2003.

* cited by examiner

*Primary Examiner* — Peter D Mulcahy
(74) *Attorney, Agent, or Firm* — Birch, Stewart, Kolasch & Birch, LLP

(57) ABSTRACT

A polyvinylidene fluoride resin composition containing a polyvinylidene fluoride resin and titanium oxide, wherein the content of the titanium oxide is 5 to 100 parts by weight per 100 parts by weight of the polyvinylidene fluoride resin, the resin composition contains, as a heat stabilizer, at least one compound selected from the group consisting of calcium polyhydroxymonocarboxylates, calcium salts of aliphatic carboxylic acids having 5 to 30 carbon atoms, calcium carbonate, calcium hydroxide, zinc oxide and magnesium oxide in a proportion of 0.1 to 20 parts by weight, and a weight ratio of the titanium oxide to the heat stabilizer is 100:1 to 3:1.

19 Claims, 4 Drawing Sheets

POLYVINYLIDENE FLUORIDE RESIN COMPOSITION, WHITE RESIN FILM, AND BACKSHEET FOR SOLAR CELL MODULE

TECHNICAL FIELD

The present invention relates to a polyvinylidene fluoride resin composition containing titanium oxide, a white resin film formed from the resin composition and a backsheet for solar cell module comprising the white resin film.

BACKGROUND ART

A solar cell is a generator directly converting sunlight to electric energy. The solar cell is roughly divided into a cell using a silicon semiconductor as a material and a cell using a compound semiconductor as a material. The silicon semiconductor solar cell includes a single crystal silicon solar cell, a polycrystalline silicon solar cell and an amorphous silicon solar cell.

The compound semiconductor is a semiconductor produced by combining a plurality of elements. The compound semiconductor cell includes a solar cell using a group III-V compound semiconductor (for example, GaAs) composed of a combination of a group III element such as Al, Ga or In and a group V element such as As or Sb, and a solar cell using a group II-VI compound semiconductor (for example, CdS or CdTe) composed of a combination of a group II element such as Zn or Cd and a group VI element such as S, Se or Te. In addition, development of a copper indium selenide solar cell, a dye-sensitized solar cell, an organic thin-film solar cell, etc. is also advanced.

A typical solar cell module is formed from a surface protecting material, a sealing material, solar cells, a back surface protecting material and a frame. As illustrated in FIG. 7, the main components of the solar cell module 71 include a surface protecting material 72, a sealing material 73, solar cells 74 and a back surface protecting material 76. A plurality of the solar cells 74 is connected in series by wirings 75 to form the solar cell module. A frame (not illustrated) is arranged at end portions or peripheral edge portions of the solar cell module.

As the surface protecting material 72, is used, for example, a reinforced glass plate, a transparent plastic plate or a transparent plastic film. As the sealing material 73, is commonly used an ethylene-vinyl acetate copolymer. As the back surface protecting material 76, is used, for example, a single-layer or multi-layer plastic film, a plastic plate, a reinforced glass plate or a metal plate (for example, aluminum plate or painted steep plate). As the frame, is commonly used, for example, aluminum light in weight and excellent in environmental resistance.

The structure of the solar cell 74 varies according to the kind of the solar cell used. For example, a structure that n-type silicon and p-type silicon and n-type silicon are joined, and electrodes are respectively arranged therein is representative of a silicon semiconductor solar cell. Examples of other solar cells include those having a layer structure of "collecting electrode/transparent conductor layer/photo-activated semiconductor layer/reflecting layer/conductive substrate". The photo-activated semiconductor layer is formed of, for example, an amorphous silicon semiconductor. That obtained by arranging and connecting a plurality of solar cells and packaging them with a surface protecting material, a sealing material and a back surface protective material is called a solar cell module. That obtained by connecting a plurality of solar cell modules is called a solar cell array.

The solar cell module (including the array) is generally placed in the outdoors, and its operation state is thereafter retained over a long period of time. In order to operate the solar cell module over a long period of time in the outdoors, it is necessary for such a module to have excellent durability under a severe environment. Therefore, the surface protecting material, sealing material and back surface protecting material (hereinafter referred to as "backsheet") of the solar cell module are required to have a function of protecting the solar cells over a long period of time under a severe natural environment surrounding the solar cell module.

In the backsheet for solar cell module, its surface (outermost surface) on the side opposing the solar cells is exposed directly to the outdoors. A surface (surface adjoining the sealing material) of the backsheet for solar cell module on the side of the solar cells is exposed to sunlight passing through between respective solar cells or between respective solar cell modules. Therefore, the backsheet for solar cell is required to be excellent in various properties such as light resistance, weather resistance, heat resistance, moisture resistance, water vapor barrier property, electrical insulating property, withstand voltage, mechanical properties, chemical resistance, salt resistance, stain resistance and adhesion property to sealing materials.

The backsheet for solar cell module is also required to be beautiful in the appearance of the surface on the side of the solar cells and additionally to have a function of efficiently reflecting sunlight incident on the backsheet in addition to the above excellent various properties. If the incident light passed through between the respective solar cells can be efficiently reflected by the backsheet, the power conversion efficiency of the solar cells is improved by the reflected light.

Japanese Patent Application Laid-Open No. 2002-100788 (Patent Literature 1) discloses backsheets for solar cell covering material, which are respectively composed of a 3-layer laminate of a hydrolysis-resistant resin film, a metal oxide-coated film and a white resin film; and a 2-layer laminate of a hydrolysis-resistant resin film coated with a metal oxide and a white resin film.

Patent Literature 1 describes that the white resin film is arranged on the innermost layer of the backsheet, whereby light incident on the backsheet can be effectively reflected and reused to enhance the power conversion efficiency of the solar cells. Patent Literature 1 discloses a white resin film formed of a resin composition obtained by adding a white pigment such as titanium oxide to a thermoplastic resin such as polyethylene terephthalate, polycarbonate, polymethyl methacrylate, polyacrylate, polyethylene naphthalate or acryl.

Japanese Patent Application Laid-Open No. 2007-35694 (Patent Literature 2; corresponding to EP 1938967 A1) discloses a backsheet for solar cell module with a cured coating film of a curable functional group-containing fluoropolymer paint formed on at least one surface of a water-impermeable sheet. Patent Literature 2 describes that a white pigment such as titanium oxide or a black pigment such as carbon black is desirably incorporated into the curable functional group-containing fluoropolymer paint for making the appearance of a solar cell module beautiful.

Patent Literature 2 exemplifies various kinds of fluoropolymers and describes that among these, a tetrafluoroethylene (TEL) polymer is preferred because the polymer is excellent in dispersibility of a pigment, weather resistance, copolymerizability with a curable functional group-containing monomer and chemical resistance. Example of Patent Literature 2 shows a backsheet obtained by forming a white cured coating film with a white paint containing a curable TEL polymer and titanium oxide on a water-impermeable sheet.

Japanese Patent Application Laid-Open No. 2007-208179 (Patent Literature 3) discloses a plastic film for back surface protecting film of a solar cell having an average reflection rate of at least 70% in a wavelength range of 600 to 1,400 nm. This plastic film for back surface protecting film of the solar cell has high reflection properties in both visible light region and near-infrared light region and exhibits a function of enhancing a photovoltaic power generation efficiency. Patent Literature 3 describes that an inorganic white pigment such as titanium oxide is incorporated into a plastic making up the plastic film for achieving high reflection properties. Patent Literature 3 exemplifies various kinds of thermoplastic resins as the plastic and describes that among these, polyesters are particularly preferred. Example of Patent Literature 3 shows a plastic film formed of a resin composition obtained by adding an inorganic white pigment such as titanium oxide into a polyethylene terephthalate copolymer.

International Publication No. 2008/157159 (Patent Literature 4; corresponding to EP 2158614 A1) discloses a solar cell module equipped with a backsheet comprising a functionalized polyvinylidene fluoride (PVDF) resin composition. The PVDF resin composition forms an outermost layer of the backsheet. Examples 1 and 2 of Patent Literature 4 show laminated films obtained by forming a coating layer of a PVDF resin composition with a coating liquid containing a PVDF resin, polymethyl methacrylate and titanium oxide on a polyethylene terephthalate (PET) film.

International Publication No. 2007/085769 (Patent Literature 5; corresponding to US 2009/0275251 A1) discloses an invention relating to a multi-layer structure comprising a PVDF film and a polyethylene terephthalate (PET) or polyethylene naphthalate (PEN) film, and Examples 1 and 2 thereof show multi-layer films comprising a resin composition layer containing a PVDF resin, titanium oxide and polymethyl methacrylate (PMMA).

International Publication No. 2008/019229 (Patent Literature 6; corresponding to US 2010/0000601 A1) discloses a solar cell module comprising a transparent and glossy material composed of a solid thermoplastic substrate layer and a PVDF outer layer and shows that PMMA may be blended into the PVDF outer layer. This PVDF outer layer is arranged as a front surface layer of the solar cell module and is not a white resin film containing titanium oxide.

As the backsheet for solar cell module, is generally used a single-layer or multi-layer plastic film, a plastic plate, reinforced glass plate, a metal plate, a composite of a plastic film and a metal plate, a composite of a plastic film and a metal foil or the like. As the metal plate, is also used that obtained by forming a synthetic resin coating film on the surface thereof.

As the plastic film, a fluororesin film, a PET film and a composite film thereof are preferred from the viewpoint of satisfying the various properties required of the backsheet for solar cell module. The fluororesin film and the composite film of the fluororesin film and the PET film are more preferred from the viewpoints of light resistance, weather resistance, heat resistance, stain resistance, etc.

As the fluororesin film for the backsheet for solar cell module, is generally a polyvinyl fluoride (PVF) resin film. However, a polyvinylidene fluoride (PVDF) resin film is more suitable for use as the backsheet for solar cell module than the PVF resin film from the viewpoints of weather resistance, stain resistance, heat resistance, etc. When a white resin film formed of a PVDF resin composition obtained by containing titanium oxide into a PVDF resin is used as a backsheet for solar cell module, the appearance of the module can be made beautiful, and in addition, the film is expected to contribute to improvement in power conversion efficiency of solar cells.

By the way, according to the results of researches by the present inventors, it has been proved that when titanium oxide is contained in a PVDF resin, the thermal decomposition temperature of the PVDF resin is greatly lowered. The PVDF resin has a melting point of 177° C. and a thermal decomposition starting temperature of 350° C. When the resin is heated to 350° C. or higher, hydrogen fluoride (HF) gas is generated to decompose the resin. These melting point and thermal decomposition starting temperature are both typical values of the PVDF resin. The fact that the range from the melting point to the thermal decomposition starting temperature is wide indicates that the processing temperature of the PVDF resin is wide. On the other hand, titanium oxide is particularly excellent in color tone and shielding ability (light scattering ability) among inorganic white pigments and can contribute to improvements in the color tone and reflection properties of a white resin film.

In order to form a white resin film from the PVDF resin, it is necessary to blend a relatively large amount of titanium oxide into the PVDF resin. It has been proved that when a PVDF resin composition obtained by causing a relatively large amount of titanium oxide to be contained in the PVDF resin is extruded to form a white resin film (including a sheet), the resultant white resin film is liable to change its color to brown, and the PVDF resin becomes easy to be thermally decomposed. It has been found that when a PVDF resin composition obtained by causing titanium oxide in an amount enough to impart shielding ability and whiteness degree that are suitable for a backsheet for solar cell module to be contained in the PVDF resin is subjected to a thermogravimetric measurement by a thermogravimetric analysis (TGA), a temperature at 10%-weight loss on heating is lowered by all of from about 40° C. to about 45° C. compared with the PVDF resin alone. The temperature at 10%-weight loss on heating of the PVDF resin is typically within a range of from about 382° C. to about 385° C. On the other hand, the temperature at 10%-weight loss on heating of, for example, a PVDF resin composition obtained by causing 30 parts by weight of titanium oxide to be contained in 100 parts by weight of this PVDF resin is lowered to a range of from about 336° C. to about 342° C.

In addition, when a film formed from the PVDF resin composition containing the PVDF resin and titanium oxide is subjected to a heat test in a gear oven heated to a temperature of 230 to 270° C., the film is changed in its color to dark brown after several hours, and bubbling presumed to be traces of having generated gasses by decomposition is also observed. Even when polymethyl methacrylate compatible with the PVDF resin is contained in the resin composition containing the PVDF resin and titanium oxide, lowering of heat resistance and color change by heating which are attributable to titanium oxide cannot be improved. Such defects cannot be solved even when a method of using the PVDF resin composition as a coating liquid to form a coating film is adopted.

Although the PVDF resin film has excellent various properties suitable for use as a backsheet for solar cell module, lowering of heat resistance and appearance is marked when titanium oxide is contained therein, and such a film become poor in durability. Therefore, it has been extremely difficult to obtain a white resin film capable of making the appearance of a solar cell module beautiful, and enhancing the power conversion efficiency of solar cells, and excellent in durability by using the PVDF resin composition obtained by blending titanium oxide into the PVDF resin.

CITATION LIST

Patent Literature

Patent Literature 1: Japanese Patent Application Laid-Open No. 2002-100788

Patent Literature 2: Japanese Patent Application Laid-Open No. 2007-35694 (corresponding to EP 1938967 A1)

Patent Literature 3: Japanese Patent Application Laid-Open No. 2007-208179

Patent Literature 4: International Publication No. 2008/157159 (corresponding to EP 2158614 A1)

Patent Literature 5: International Publication No. 2007/085769 (corresponding to US 2009/0275251 A1)

Patent Literature 6: International Publication No. 2008/019229 (corresponding to US 2010/0000601 A1)

SUMMARY OF INVENTION

Technical Field

It is an object of the present invention to provide a polyvinylidene fluoride resin composition inhibited from being thermally decomposed and being colored even when a relatively large amount of titanium oxide is contained in a polyvinylidene fluoride resin.

Another object of the present invention is to provide a white resin film, by which thermal decomposition and color change by heating upon forming and processing can be inhibited, and thermal decomposition and color change by heating with time are markedly inhibited, and which is excellent in appearance, shielding ability (light scattering ability) and durability, by using a PVDF resin composition obtained by causing a relatively large amount of titanium oxide to be contained in a polyvinylidene fluoride resin.

A further object of the present invention is to provide a white resin film which has various properties suitable for a backsheet for solar cell module and is excellent in durability, by using a PVDF resin composition containing a polyvinylidene fluoride resin and titanium oxide.

The present inventors have carried out extensive researches with a toward achieving the above objects. As a result, it has been found that when a particular compound is added together with titanium oxide to a polyvinylidene fluoride resin (PVDF resin), the compound acts as a heat stabilizer, and consequently a PVDF resin composition capable of sufficiently inhibiting thermal decomposition and color change by heating upon forming and processing or with time even when a relatively large amount of titanium oxide is blended is obtained.

A white resin film (including a sheet) formed from the PVDF resin composition according to the present invention is markedly inhibited from being thermally decomposed and changing its color by heating, is excellent in appearance, shielding ability (light scattering ability), heat resistance and durability and has various properties suitable for a backsheet for solar cell module. The present invention has been led to completion on the basis of these findings.

Solution to Problem

According to the present invention, there is provided a polyvinylidene fluoride resin composition comprising a polyvinylidene fluoride resin and titanium oxide, wherein
(a) the content of the titanium oxide is within a range of 5 to 100 parts by weight per 100 parts by weight of the polyvinylidene fluoride resin,
(b) the polyvinylidene fluoride resin composition contains, as a heat stabilizer, at least one compound selected from the group consisting of calcium polyhydroxymonocarboxylates, calcium salts of aliphatic carboxylic acids having 5 to 30 carbon atoms, calcium carbonate, calcium hydroxide, zinc oxide and magnesium oxide,
(c) the content of the heat stabilizer is within a range of 0.1 to 20 parts by weight per 100 parts by weight of the polyvinylidene fluoride resin, and
(d) a weight ratio of the titanium oxide to the heat stabilizer is within a range of 100:1 to 3:1.

According to the present invention, there is also provided a white resin film formed from a polyvinylidene fluoride resin composition containing a polyvinylidene fluoride resin and titanium oxide, wherein
(i) the content of the titanium oxide is within a range of 5 to 100 parts by weight per 100 parts by weight of the polyvinylidene fluoride resin,
(ii) the polyvinylidene fluoride resin composition contains, as a heat stabilizer, at least one compound selected from the group consisting of calcium polyhydroxymonocarboxylates, calcium salts of aliphatic carboxylic acids having 5 to 30 carbon atoms, calcium carbonate, calcium hydroxide, zinc oxide and magnesium oxide,
(iii) the content of the heat stabilizer is within a range of 0.1 to 20 parts by weight per 100 parts by weight of the polyvinylidene fluoride resin, and
(iv) a weight ratio of the titanium oxide to the heat stabilizer is within a range of 100:1 to 3:1.

According to the present invention, there is further provided a backsheet for solar cell module, comprising a layer formed of the white resin film.

Advantageous Effects of Invention

According to the present invention, there is provided a polyvinylidene fluoride resin composition capable of inhibiting thermal decomposition and color change by heating upon forming and processing even when a relatively large amount of titanium oxide is contained in a polyvinylidene fluoride resin. According to the present invention, there is provided a white resin film which is formed of a resin composition obtained by causing a relatively large amount of titanium oxide to be contained in a PVDF resin, is capable of inhibiting thermal decomposition and color change by heating upon forming and processing, is markedly inhibited from being thermally decomposed and changing its color by heating with time, and is excellent in appearance, shielding ability (light scattering ability), heat resistance and durability. According to the present invention, there is further provided a white resin film which is formed from a PVDF resin composition containing a PVDF resin and titanium oxide, has various properties suitable for a backsheet for solar cell module and is excellent in durability.

REFERENCE SIGNS LIST

Figure 1:
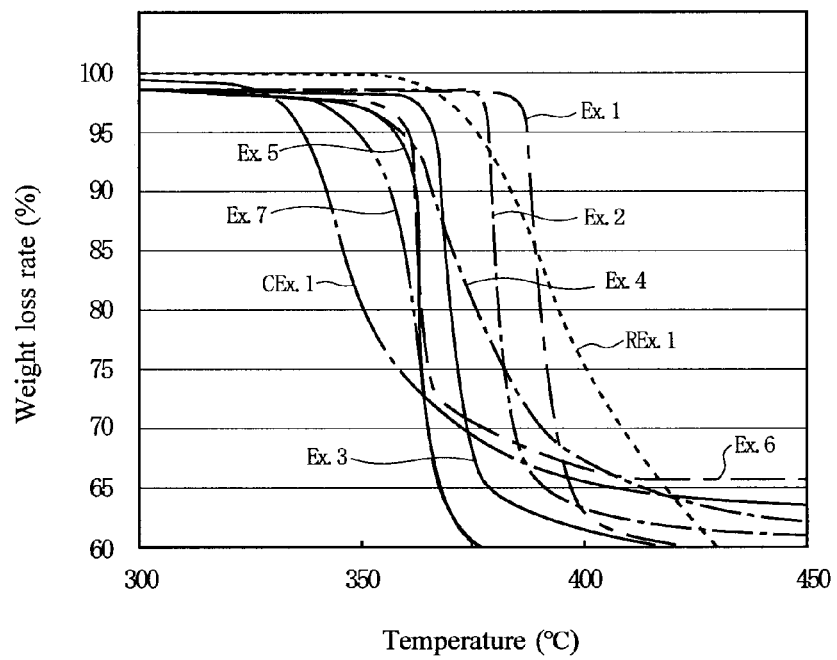
FIG. 1 is a graph illustrating the results of thermogravimetric measurements of respective PVDF resin compositions prepared in Referential Example 1 (REx. 1), Examples 1 to 7 (Ex. 1 to Ex. 7) and Comparative Example 1 (CEx. 1) according to the thermogravimetric analysis (TGA).

71: Solar cell module
72: Surface protecting material
73: Sealing material
74: Solar cells
75: Wirings
76: Back surface protecting material (backsheet)

DESCRIPTION OF EMBODIMENTS

1. Polyvinylidene Fluoride Resin

The polyvinylidene fluoride resin (PVDF resin) used in the present invention means a homopolymer of vinylidene fluoride or a vinylidene fluoride copolymer comprising vinylidene fluoride as a principal component. The PVDF resin used in the present invention is a crystalline resin exhibiting various crystal structures such as α type, β type, γ type, and lap type. The PVDF resin used in the present invention is not an elastomer (fluororubber) with the crystallinity lost.

Examples of the vinylidene fluoride copolymer include vinylidene fluoride-hexafluoropropylene copolymers, vinylidene fluoride-tetrafluoroethylene copolymers, vinylidene fluoride-chlorotrifluoroethylene copolymers, vinylidene fluoride-trifluoroethylene copolymers, vinylidene fluoride-tetrafluoroethylene-hexafluoropropylene terpolymers, vinylidene fluoride-chlorotrifluoroethylene-hexafluoropropylene terpolymers and mixtures of two or more copolymers thereof.

In these vinylidene fluoride copolymers, the copolymerization ratio of the comonomer(s) is preferably 15 mol % or lower, more preferably 10 mol % or lower, particularly preferably 5 mol % or lower. When the copolymerization ratio of the comonomer(s) is 15 mol % or lower, such a vinylidene fluoride copolymer becomes a crystalline thermoplastic resins. The lower limit of the proportion of the comonomer(s) is preferably 1 mol %. If the copolymerization ratio of the comonomer(s) is too high, such a vinylidene fluoride copolymer loses crystallinity and becomes an elastomer.

The homopolymer of vinylidene fluoride is a crystalline resin. In order to lose crystallinity by copolymerization of vinylidene fluoride and a comonomer to provide an elastomer, it is necessary to increase the copolymerization ratio of the comonomer. In a commercially available polyvinylidene fluoride elastomer, the copolymerization ratio of the comonomer is actually 20 mol % or higher.

At least one polymer selected from the group consisting of a vinylidene fluoride homopolymer and vinylidene fluoride copolymers the copolymerization ratio of the comonomer(s) of which is 15 mol % or lower may be used as the PVDF resin. Among the PVDF resins, the vinylidene fluoride homopolymer and vinylidene fluoride-hexafluoropropylene copolymers containing a hexafluoropropylene unit in a proportion of 15 mol % or lower are preferred from the viewpoints of heat resistance, melt formability or moldability, mechanical properties, stain resistance, solvent resistance and secondary processability.

The PVDF resin can be generally prepared by a suspension polymerization process or emulsion polymerization process. In the emulsion polymerization process, a chemically stable fluorinated emulsifier is used to emulsify vinylidene fluoride alone or vinylidene fluoride and a comonomer such as hexafluoropropylene in an aqueous medium. Then, an inorganic peroxide, organic peroxide, organic percarbonate compound or the like is used as a polymerization initiator to conduct polymerization. After the emulsion polymerization, a fine latex of sub-micron unit is precipitated and aggregated with a flocculant, whereby the PVDF resin can be collected as particles having a proper size.

In the suspension polymerization process, a suspending agent such as methyl cellulose is used to suspend vinylidene fluoride or vinylidene fluoride and a comonomer in an aqueous medium. For example, an organic percarbonate (for example, di-n-propyl peroxydicarbonate) having activity at a low temperature is used as a polymerization initiator to initiate polymerization at a temperature not higher than a critical temperature of 30.1° C. of vinylidene fluoride, preferably 10 to 30° C., more preferably 20 to 28° C., thereby forming primary polymer particles, and the temperature is raised to 30 to 90° C., preferably 40 to 80° C., as needed, to continue the polymerization reaction, thereby forming secondary polymer particles.

The intrinsic viscosity of the PVDF resin is within a range of preferably 0.70 to 1.50 dl/g, more preferably 0.80 to 1.30 dl/g. The intrinsic viscosity of the PVDF resin is a logarithmic viscosity at 30° C. of a solution with 4 g of the PVDF resin dissolved in 1 liter of N,N-dimethylformamide as measured by means of an Ubbellohde viscometer.

The melting point of the PVDF resin is within a range of generally 130 to 177° C., often 150 to 177° C. The melting point of the PVDF resin is a value measured by means of a differential scanning calorimeter (DSC). The melting point of the vinylidene fluoride homopolymer obtained by the suspension polymerization process is 177° C. When the PVDF resin is heated to a temperature of 350° C. or higher, HF gas is generated to decompose the resin. The PVDF resin has a wide processable temperature range from its melting point to its decomposition point. The melt-processable temperature of the PVDF resin is generally within a range of 200 to 250° C.

2. Titanium Oxide

As titanium oxide, those having 2 crystal forms of anatase-type and rutile-type are widely used. In the present invention, those of these 2 crystal forms may be used. Among these, titanium oxide having a rutile-type crystal form is preferred because it is excellent in dispersibility in the PVDF resin at a high temperature and extremely small in volatility.

As titanium oxide, that of the grade for pigment may be preferably used. The average particle diameter (average primary particle diameter) of titanium oxide according to the image analysis of an image taken by a transmission electron microscope is within a range of generally 150 to 1,000 nm, preferably 200 to 700 nm, more preferably 200 to 400 nm If the average particle diameter of titanium oxide is too small, its shielding ability is lowered. The average particle diameter of titanium oxide falls within the above range, whereby its refractive index becomes high, and so the light scattering ability thereof is strong, so that its shielding ability as a white pigment becomes high. Titanium oxide is generally present in the form of secondary particles with primary particles aggregated. The specific surface area of titanium oxide as measured by the BET method is within a range of generally 1 to 15, often 5 to 15.

Titanium oxide is subjected to a surface treatment with a surface treatment agent, whereby its properties such as dispersibility, shielding ability and weather resistance can be improved. Examples of the surface treatment agent include oxides of metals such as aluminum, silicon, zirconium, tin, cerium and bismuth; hydrated metal oxides such as zinc oxide; organic metal compounds such as organic aluminum compounds, organic titanium compounds and organic zirconium compounds; organic silicon compounds such as silane coupling agents and polysiloxanes; phosphorus compounds such as aluminum phosphate and organic phosphates; and amine compounds.

Titanium oxide is coated with the surface treatment agent, whereby reactions between the surface of titanium oxide and surrounding environments can be inhibited. The titanium oxide surface-treated is excellent in dispersibility in the PVDF resin. The titanium oxide surface-treated can be dispersed at a high concentration in the PVDF resin.

When titanium oxide surface-treated with the same substance as that used as the heat stabilizer in the present invention is used, the amount of the surface treatment agent adhered is extremely small, so that the amount thereof is not included in the amount of the heat stabilizer used in the present invention. In fact, the heat resistance of the PVDF resin composition cannot be improved even if the titanium oxide surface-treated with the same substance as that used as the heat stabilizer in the present invention is used.

3. Heat Stabilizer

Examples of the heat stabilizer used in the present invention include at least one inorganic calcium compound selected from the group consisting of calcium polyhydroxymonocarboxylates, calcium salts of aliphatic carboxylic acids having 5 to 30 carbon atoms, calcium carbonate and calcium hydroxide; and at least one metal oxide selected from the group consisting of zinc oxide and magnesium oxide. These heat stabilizers may be used either singly or in any combination thereof.

It has been found that calcium polyhydroxymonocarboxylates are useful as the heat stabilizer. A polyhydroxymonocarboxylic acid is a compound belonging to hydroxycarboxylic acids and is a general name of a compound having one carboxyl group and plural alcoholic hydroxyl groups in a molecule. Examples of the polyhydroxymonocarboxylic acid include glyceric acid, 2,3-diphospho-D-glyceric acid, 9,10-dihydroxyoctadecanoic acid and gluconic acid. The calcium polyhydroxymonocarboxylates may be used either singly or in any combination thereof. Calcium gluconate is preferred as the calcium polyhydroxymonocarboxylate. The calcium polyhydroxymonocarboxylate may be a hydrate. No limitation is imposed on the kinds of isomers thereof if any. Examples of commercially available calcium polyhydroxymonocarboxylates include calcium gluconate monohydrate (guaranteed reagent, product of KANTO CHEMICAL CO., INC.).

When a calcium monohydroxymonocarboxylate such as, for example, calcium lactate is used even when it is the calcium salt of a hydroxycarboxylic acid, the inhibiting effect on the thermal decomposition becomes insufficient, or coloring or bubbling may be exhibited in some cases under a high-temperature environment even when the inhibiting effect on the thermal decomposition is exhibited.

It has been found that calcium salts of aliphatic carboxylic acids having 5 to 30 carbon atoms are useful as the heat stabilizer. As examples of the aliphatic carboxylic acids having 5 to 30 carbon atoms, may be mentioned saturated aliphatic monocarboxylic acids having 5 to 30 carbon atoms, such as pivalic acid, hexanoic acid, heptanoic acid, octanoic acid, nonanoic acid, decanoic acid, undecanoic acid, lauric acid, palmitic acid, heptadecanoic acid, stearic acid, icosanoic acid, behenic acid, cerotic acid and triacontanoic acid; and unsaturated aliphatic monocarboxylic acids having 5 to 30 carbon atoms, such as angelic acid, tiglic acid, 4-pentenoic acid, α-ethylcrotonic acid, 10-undecenoic acid, oleic acid, elaidic acid, erucic acid, brassidic acid, 21-triacontenoic acid, sorbic acid, linoleic acid, α-eleostearic acid, α-linolenic acid and arachidonic acid. The calcium salts of these aliphatic carboxylic acids may be used either singly or in any combination thereof.

The calcium salts of saturated fatty acids having 10 to 30 carbon atoms, such as calcium stearate, are more preferred as the calcium salts of the saturated aliphatic monocarboxylic acids in that such compounds are excellent in the inhibiting effect on the coloring and thermal decomposition. The calcium salts of unsaturated fatty acids having 11 to 30 carbon atoms, such as calcium oleate, are preferred as the calcium salts of the unsaturated aliphatic monocarboxylic acids. Examples of commercially available calcium salts of aliphatic carboxylic acids include calcium stearate (extra pure reagent, product of KANTO CHEMICAL CO., INC.) and calcium oleate (extra pure reagent, product of KANTO CHEMICAL CO., INC.).

In case of the calcium salt of a carboxylic acid having a little carbon atoms, such as calcium acetate even when it is the calcium salt of a carboxylic acid, the inhibiting effect on the thermal decomposition cannot be achieved. When a free aliphatic carboxylic acid that does not form a salt with calcium, such as stearic acid, is used, the inhibiting effect on the thermal decomposition also cannot be achieved.

At least one inorganic calcium compound selected from the group consisting of calcium carbonate and calcium hydroxide may be used as the heat stabilizer. Calcium carbonate and calcium hydroxide are preferred because they are particularly excellent in the inhibiting effect on the thermal decomposition. Examples of commercially available products of the inorganic calcium compound include calcium carbonate (SL-1500, product of TAKEHARA KAGAKU KOGYO CO., LTD.) and calcium hydroxide (guaranteed reagent, product of Junsei Chemical Co., Ltd.). When another inorganic calcium compound such as calcium chloride is used even when it is an inorganic calcium compound, the inhibiting effect on the thermal decomposition cannot be achieved.

It has been found that at least one metal oxide selected from the group consisting of zinc oxide and magnesium oxide is useful as the heat stabilizer. Examples of commercially available products of the metal oxide include zinc oxide (fine zinc oxide, product of SAKAI CHEMICAL INDUSTRY CO., LTD.) and magnesium oxide (guaranteed reagent, product of KANTO CHEMICAL CO., INC.). When another inorganic calcium compound such as silicon oxide, aluminum oxide, iron (III) oxide or zirconium oxide is used even when it is a metal oxide, the inhibiting effect on the thermal decomposition cannot be achieved, or the inhibiting effect on the thermal decomposition becomes insufficient.

When other inorganic compounds such as, for example, molybdenum disulfide, zirconium tetrachloride, calcium chloride and magnesium hydroxide are used, the inhibiting effect on the thermal decomposition becomes insufficient, or the thermal decomposition may be rather promoted in some cases. Some compound exhibiting an excellent inhibiting effect on the thermal decomposition like iron chloride makes the appearance of a product defective, since when the resulting resin composition is formed into a formed product such as a film, its surface become uneven, or piece-falling-off occurs.

As the heat stabilizer used in the present invention, calcium carbonate, calcium hydroxide, calcium gluconate, zinc oxide, calcium oleate, magnesium oxide and calcium stearate are preferred in that such compounds are excellent in the inhibiting effect on the thermal decomposition, calcium carbonate, calcium hydroxide, calcium gluconate, zinc oxide, calcium oleate and magnesium oxide are more preferred, calcium carbonate, calcium hydroxide, calcium gluconate and zinc oxide are still more preferred, and calcium carbonate and calcium hydroxide are particularly preferred.

These heat stabilizers are generally used in the form of powder from the viewpoint of dispersibility in the PVDF resin. For example, the inorganic calcium compounds such as calcium carbonate and the metal oxides such as zinc oxide preferably have an average particle diameter (average primary particle diameter) within a range of 0.05 to 2 µm as measured according to the image analysis of an image taken by a transmission electron microscope. The effect to improve the thermal decomposition temperature of the PVDF resin can be more exhibited as this average particle diameter becomes smaller. Therefore, the average particle diameters of the inorganic calcium compounds and the metal oxides more preferably fall within a range of 0.05 to 1 µm.

4. PVDF Resin Composition

The content of titanium oxide in the PVDF resin composition according to the present invention is within a range of generally 5 to 100 parts by weight, preferably 10 to 80 parts by weight, more preferably 15 to 70 parts by weight, particularly preferably 20 to 60 parts by weight per 100 parts by weight of the PVDF resin. If the content of titanium oxide is too low, it is difficult to provide a resin film having a whiteness degree and shielding ability sufficient to be used as a backsheet for solar cell module. If the content of titanium oxide is too high, it is difficult to produce a resin film by extrusion, and moreover the mechanical strength of the resulting resin film is lowered.

The content of the heat stabilizer in the PVDF resin according to the present invention is within a range of generally 0.1 to 20 parts by weight, preferably 0.3 to 15 parts by weight, more preferably 0.5 to 10 parts by weight, particularly preferably 0.8 to 8 parts by weight per 100 parts by weight of the PVDF resin. If the content of the heat stabilizer is too low, its effect on heat stabilization becomes small, and it is thus difficult to sufficiently inhibit the lowering of the thermal decomposition temperature of the PVDF resin component in the PVDF resin composition. If the content of the heat stabilizer is too high, there is a possibility that the shielding ability, color tone, mechanical properties, etc. of the resulting resin film may be adversely affected.

In order to efficiently enhance the effect by the heat stabilizer on the heat stabilization, it is preferable to adjust the content of the heat stabilizer according to the content of titanium oxide in the PVDF resin composition. The content of the heat stabilizer is generally made lower than the content of titanium oxide. A weight ratio of titanium oxide to the heat stabilizer is within a range of generally 100:1 to 3:1, preferably 80:1 to 4:1, more preferably 50:1 to 5:1.

Other additives such as a pigment dispersant, an ultraviolet absorbent, a light stabilizer, a delustering agent, a lubricant, a tint adjustor (for example, a colorant such as carbon black), a crystal nucleating agent and a mechanical property improver (for example, an elastomer such as an acrylic elastomer) may be contained in the PVDF resin composition according to the present invention if desired. These additives are used in their proper proportion if desired. When these additives are used, they are, independently of one another, used in a proportion of preferably 10 parts by weight or lower, more preferably 5 parts by weight or lower, particularly preferably 3 parts by weight or lower per 100 parts by weight of the PVDF resin. When these additives are used, the lower limits of their contents are, independently of one another, generally 0.001 parts by weight, often 0.01 parts by weight per 100 parts by weight of the PVDF resin.

Another thermoplastic resin such as polymethyl methacrylate compatible with the PVDF resin may be contained in the PVDF resin composition according to the present invention. Another thermoplastic resin is used in a proportion of preferably 30 parts by weight or lower, more preferably 25 parts by weight or lower per 100 parts by weight of the PVDF resin. When another thermoplastic resins is used, the lower limit of the proportion used is generally 0.01 parts by weight, preferably 0.1 parts by weight, more preferably 1 part by weight. Among other thermoplastic resins, polymethyl methacrylate (PMMA) is particularly preferred because this polymer has excellent compatibility with the PVDF resin and moreover can improve the adhesion property of a white resin film formed from the PVDF resin composition to other materials.

The PVDF resin composition can be prepared by a process of dry-blending powder of the PVDF resin, titanium oxide and the heat stabilizer. The powder or pellets of the PVDF resin is fed together with titanium oxide and the heat stabilizer to an extruder, these components are melted and kneaded and melt-extruded in the form of strand, and the resultant strand was cut, whereby pellets of the PVDF resin composition can be obtained.

When the PVDF resin composition is used as a powder paint, the PVDF resin composition is prepared by a process of dry-blending powder of the PVDF resin, titanium oxide and the heat stabilizer. When other additives and/or other thermoplastic resins are used, they are contained in this blending step. Such a dry blend product can be not only used as a powder paint, but also melt-extruded as a film (including a sheet) by feeding it to an extruder.

The PVDF resin composition may be provided in the form of an organosol paint if desired. The organosol paint can be prepared by a process of dispersing powder of the PVDF resin, titanium oxide, the heat stabilize, an acrylic resin (film-forming aid), other additives and/or other thermoplastics added if desired, and an organic solvent by means of a roll mill, sand grinder or the like according to a method known per se in the art. The PVDF resin composition may also be provided in the form of a dispersion paint according to a method known per se in the art.

The PVDF resin composition according to the present invention exhibits a temperature at 10%-weight loss on heating of generally 345° C. or higher, preferably 350° C. or higher, more preferably 355° C. or higher, particularly preferably 365° C. or higher when it is subjected to a thermogravimetric measurement by a thermogravimetric analysis (TGA).

The temperature at 10%-weight loss on heating of the PVDF resin composition according to the present invention may vary according to the kind of titanium oxide used. However, the PVDF resin composition according to the present invention exhibits increase in the temperature at 10%-weight loss on heating by generally 10° C. or higher, preferably 12° C. or higher, more preferably 15° C. or higher, still more preferably 19° C. or high, particularly preferably 20° C. or 25° C. or higher compared with a PVDF resin composition containing titanium oxide alone and containing no heat stabilizer. The PVDF resin composition according to the present invention also exhibits lowering in the temperature at 10%-weight loss on heating by generally 30° C. or lower, preferably 25° C. or lower, more preferably 20° C. or lower, particularly preferably 15° C. or lower compared with the PVDF resin alone.

5. White Resin Film

The PVDF resin composition is fed to an extruder and melt-extruded from a T-die arranged at the tip of the extruder in the form of a film, whereby a white resin film can be formed. In the present invention, the resin film includes not only a film having a thickness less than 250 μm but also a sheet (including a plate) having a thickness of 250 μm to 3 mm.

The lower limit of the thickness of the white resin film is generally 5 μm, preferably 10 μm, more preferably 12 μm, particularly preferably 15 μm. The upper limit of the thickness of the white resin film is preferably 500 μm, more preferably 300 μm, particularly preferably 100 μm or 50 μm. If the thickness of the white resin film is too small, it is difficult to achieve sufficient whiteness degree and shielding ability, and its mechanical properties are also lowered. If the thickness of the white resin film is too great, its flexibility is impaired, and it is difficult to lighten the film. When the thickness of the white resin film falls within a range of 15 to 50 μm in particular, such a film can exhibit good properties.

When the PVDF resin composition according to the present invention is used in the form of a powder paint, organosol paint or dispersion paint, its film can be formed by a process of coating the paint on a heat-resistant substrate such as a metal plate, glass plate or heat-resistant resin film and heating it.

6. Solar Cell Module and Backsheet Thereof

Figure 7:
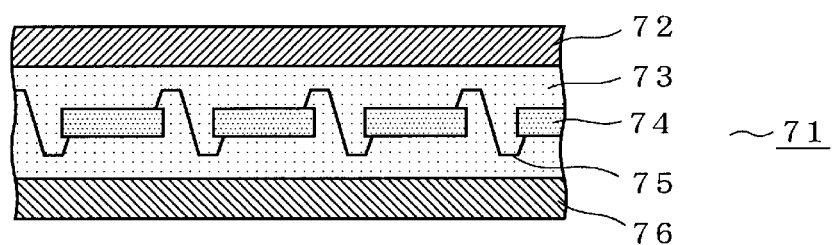
FIG. 7 schematically illustrates a section of an exemplary solar cell module.

As examples of a solar cell module on which the backsheet for solar cell module according to the present invention can be arranged, may be mentioned that having a sectional structure illustrated in FIG. 7. As illustrated in FIG. 7, the solar cell module is made up of a surface protecting material 72, a sealing material 73, solar cells 74 and a back surface protecting material 76. A plurality of the solar cells 74 is connected in series by wirings 75 to form the solar cell module. A frame (not illustrated) is arranged at end portions or peripheral edge portions of the solar cell module.

As the surface protecting material 72, is used, for example, a reinforced glass plate, a transparent plastic plate, a single-layer or multi-layer transparent plastic film or a composite material with these material composited. However, the surface protective material is not limited thereto. As the sealing material 73, is used a transparent resin such as an ethylene-vinyl acetate copolymer (EVA), a butyral resin, a silicon resin, an epoxy resin or a fluorinated polyimide resin. However, the sealing material is not limited thereto. Among these sealing materials, EVA is preferred. The structure of the solar cell 74 varies according to the kind of the solar cell used. However, various kinds of solar cells may be used.

In the present invention, a single-layer white resin film formed of the PVDF resin composition according to the present invention, a multi-layer film obtained by compositing this white resin film and another resin film (for example, a PET film), a multi-layer film obtained by compositing this white resin film and a moisture-proof film, a composite material obtained by compositing this white resin film and a reinforced glass plate, a composite material obtained by compositing this white resin film and a metal plate, a composite material obtained by compositing this white resin film and 2 or more materials of said another resin film, the moisture-proof film, the reinforced glass plate and the like, or the like is used as the back surface protecting material (backsheet) 76. In the multi-layer films and the composite materials, an adhesive layer may be arranged between respective layers. Examples of the moisture-proof film include composite films obtained by forming a deposited film of an inorganic oxide such as silicon oxide or aluminum oxide on one surface of a substrate film. Examples of commercially available moisture-proof films include CELLEL (trademark) T030 (product of KUREHA CORPORATION).

When EVA is used as the sealing material, EVA is supplied in the form of a sheet. Solar cells are sandwiched between 2 EVA sheets, and the EVA sheets are heated and pressurized, whereby the solar cells can be sealed with EVA. The EVA sheet may be supplied in the form composited with the white resin film formed of the PVDF resin composition.

As examples of preferred layer structures of the backsheet for solar cell module according to the present invention, may be mentioned the following structures. However, the structures are not limited thereto. Backsheets having a layer structure composed of plural layers are shown with a surface (layer) on a side coming into contact with the solar cell module described last.

(1) White resin film
(2) White resin film/adhesive/EVA
(3) Another resin film/white resin film
(4) Another resin film/adhesive/white resin film
(5) Another resin film/white resin film/adhesive/EVA
(6) Another resin film/adhesive/white resin film/adhesive/EVA
(7) Glass plate/adhesive/white resin film
(8) Glass plate/adhesive/white resin film/adhesive/EVA
(9) Metal plate/adhesive/white resin film
(10) Metal plate/adhesive/white resin film/adhesive/EVA
(11) Layer structures with the moisture-proof film added to the above-described layer structures.

When the backsheet for solar cell module according to the present invention is a multi-layer sheet containing the white resin film, the white resin film is caused to adjoin a sealing material (for example, EVA) layer directly or through an adhesive layer.

Examples

The present invention will hereinafter be described more specifically by the following Examples. Evaluating methods of physical properties or properties are as follows.

(1) Temperature at 10%-Weight Loss on Heating

A thermogravimetric analyzer TC 11 manufactured by METTLER INSTRUMENT AG was used to place a sample (200 mg) vacuum-dried at 30° C. for at least 6 hours in a platinum pan, and the sample was heated from 50° C. to 400° C. at a heating rate of 10° C./min under a dry nitrogen atmosphere at 10 ml/min, thereby measuring a weight loss rate during that. A temperature at which the weight was reduced by 10% of the weight at the time the measurement had been started was regarded as a temperature at 10%-weight loss on heating.

(2) Yellowness Index (YI) Value

A color-difference meter (ZE2000) manufactured by Nippon Denshoku Kogyo K.K. was used to measure a YI value according to ASTM D-1925.

Referential Example 1

A temperature at 10%-weight loss on heating of a polyvinylidene fluoride resin [KF (trademark) #850, product of KUREHA CORPORATION; suspension polymerization product]. As a result, the temperature was 382° C. The result is shown in Table 1.

Referential Example 2

A temperature at 10%-weight loss on heating of a polyvinylidene fluoride resin [KYNAR (trademark) 720, product of Arkema Co.; emulsion polymerization product]. As a result, the temperature was 385° C. The result is shown in Table 1.

Comparative Example 1

One hundred parts by weight of a polyvinylidene fluoride resin [KF (trademark) #850, product of KUREHA CORPORATION] and 30 parts by weight of titanium oxide [TI-PURE (trademark) R101, product of Du Pont Co.; rutile-type titanium oxide, average particle diameter: 0.29 μm, product surface-treated with an amine compound] were fed to a single-screw extruder, melted and kneaded at a cylinder temperature of 220° C. and melt-extruded in the form of strand from a die, and the resultant strand was cut in cold water to prepare pellets. These pellets were used to measure a temperature at 10%-weight loss on heating. As a result, the temperature was 342° C. The result is shown in Table 1.

Comparative Example 2

One hundred parts by weight of a polyvinylidene fluoride resin [KYNAR (trademark) 720, product of Arkema Co.] and 30 parts by weight of titanium oxide [TI-PURE (trademark) R101, product of Du Pont Co.; rutile-type titanium oxide, average particle diameter: 0.29 μm, product surface-treated with an amine compound] were fed to a single-screw extruder, melted and kneaded at a cylinder temperature of 220° C. and melt-extruded in the form of strand from a die, and the resultant strand was cut in cold water to prepare pellets. These pellets were used to measure a temperature at 10%-weight loss on heating. As a result, the temperature was 342° C. The result is shown in Table 1.

Comparative Example 3

An operation was conducted in the same manner as in Comparative Example 1 except that the titanium oxide was changed from TI-PURE (trademark) R101 (product of Du Pont Co.) to TI-PURE (trademark) R105 (product of Du Pont Co.; rutile-type titanium oxide, product surface-treated with silicon dioxide). As a result, the temperature at 10%-weight loss on heating of the resultant PVDF resin composition was 336° C. The result is shown in Table 1.

Comparative Example 4

An operation was conducted in the same manner as in Comparative Example 1 except that a mixture of 80 parts by weight of the polyvinylidene fluoride resin and 20 parts by weight of polymethyl methacrylate was used in place of 100 parts by weight of the polyvinylidene fluoride resin. As a result, the temperature at 10%-weight loss on heating of the resultant PVDF resin composition was lowered to 334° C. from 342° C. The result is shown in Table 1.

TABLE 1

| | Composition | | | | | | Temperature at 10%-weight loss on heating (° C.) |
|---|---|---|---|---|---|---|---|
| | Resin component | | | | | | |
| | PVDF | | PMMA | | Titanium oxide | | |
| | Kind | Part(s) | Kind | Part(s) | Kind | Part(s) | |
| Ref. Ex. 1 | A1 | 100 | — | — | — | — | 382 |
| Ref. Ex. 2 | A2 | 100 | — | — | — | — | 385 |
| Comp. Ex. 1 | A1 | 100 | — | — | B1 | 30 | 342 |
| Comp. Ex. 2 | A2 | 100 | — | — | B1 | 30 | 342 |
| Comp. Ex. 3 | A1 | 100 | — | — | B2 | 30 | 336 |
| Comp. Ex. 4 | A1 | 80 | D1 | 20 | B1 | 30 | 334 |

(Note)
A1: Polyvinylidene fluoride resin [KF (trademark) #850, product of KUREHA CORPORATION; suspension polymerization product]
A2: Polyvinylidene fluoride resin [KYNAR (trademark) 720, product of Arkema Co.; emulsion polymerization product]
B1: Titanium oxide [TI-PURE (trademark) R101, product of Du Pont Co.]
B2: Titanium oxide [TI-PURE (trademark) R105, product of Du Pont Co.]
D1: Polymethyl methacrylate (PMMA) [DELPOWDER (trademark) 70H, product of ASAHI KASEI CHEMICALS CORPORATION]

<Consideration>

As apparent from the results shown in Table 1, the resin composition (Comparative Example 1) obtained by blending 30 parts by weight of titanium oxide [TI-PURE (trademark) R101, product of Du Pont Co.] into 100 parts by weight of the PVDF resin (suspension polymerization product) is lowered in the temperature at 10%-weight loss on heating by all of 40° C. compared with the case (Referential Example 1) of the PVDF resin alone and is poor in heat resistance. Likewise, the resin composition (Comparative Example 2) obtained by blending 30 parts by weight of titanium oxide [TI-PURE (trademark) R101, product of Du Pont Co.] into 100 parts by weight of the PVDF resin (emulsion polymerization product) is lowered in the temperature at 10%-weight loss on heating by all of 43° C. compared with the case (Referential Example 2) of the PVDF resin alone and is poor in heat resistance.

The resin composition (Comparative Example 3) obtained by blending 30 parts by weight of titanium oxide [TI-PURE (trademark) R105, product of Du Pont Co.] into 100 parts by weight of the PVDF resin (suspension polymerization product) is lowered in the temperature at 10%-weight loss on heating by all of 46° C. compared with the case (Referential Example 1) of the PVDF resin alone and is poor in heat resistance. The thermal decomposition cannot be inhibited even when polymethyl methacrylate (PMMA) is contained as a resin component (Comparative Example 4).

Example 1

One hundred parts by weight of a polyvinylidene fluoride resin [KF (trademark) #850, product of KUREHA CORPORATION], 30 parts by weight of titanium oxide [TI-PURE (trademark) R101, product of Du Pont Co.; rutile-type titanium oxide, average particle diameter: 0.29 μm, surface-treated product] and 5 parts by weight of calcium carbonate (SL-1500, product of TAKEHARA KAGAKU KOGYO CO., LTD.) were fed to a single-screw extruder, melted and kneaded at a cylinder temperature of 220° C. and melt-extruded in the form of strand from a die, and the resultant strand was cut in cold water to prepare pellets. A weight ratio of titanium oxide to calcium carbonate was 6:1. These pellets were used to measure a temperature at 10%-weight loss on heating. As a result, the temperature was 389° C.

A difference between the temperature (389° C.) at 10%-weight loss on heating of this sample in Example 1 and the temperature (342° C.) at 10%-weight loss on heating of the sample in Comparative Example 1 was +47° C., and it was proved that the inhibiting effect on the thermal decomposition is markedly improved by adding calcium carbonate. A difference between the temperature (389° C.) at 10%-weight loss on heating of the sample in Example 1 and the temperature (382° C.) at 10%-weight loss on heating of the sample in Referential Example 1 was +7° C., and it was also proved that the heat resistance is improved compared with the case of the PVDF resin alone. As described above, the performance of calcium carbonate as a heat stabilizer was marked. The results are shown in Table 2.

Examples 2 to 7

Pellets were prepared in the same manner as in Example 1 except that compounds shown in Table 2 were respectively used in their corresponding proportions shown in Table 2 in place of calcium carbonate as the heat stabilizer, thereby measuring temperatures at 10%-weight loss on heating of the respective samples. A weight ratio of titanium oxide to the heat stabilizer was 6:1 (Examples 2 to 4, and Example 6) or 30:1 (Examples 5 and 6). The results are shown in Table 2.

TABLE 2

| | Composition | | | | | | Temperature at 10%-weight loss on heating | | |
| --- | --- | --- | --- | --- | --- | --- | --- | --- | --- |
| | PVDF resin | | Titanium oxide | | Additive | | | Difference (° C.) | Difference (° C.) |
| | Kind | Part(s) | Kind | Part(s) | Kind | Part(s) | $T_2$ (° C.) | $T_2 - T_1$ | $T_2 - T_0$ |
| Ref. Ex. 1 | A1 | 100 | — | — | — | — | 382 ($T_0$) | — | 0 |
| Comp. Ex. 1 | A1 | 100 | B1 | 30 | — | — | 342 ($T_1$) | 0 | −40 ($T_1 - T_0$) |
| Example 1 | A1 | 100 | B1 | 30 | C1: Calcium carbonate | 5 | 389 | +47 | +7 |
| Example 2 | A1 | 100 | B1 | 30 | C2: Calcium hydroxide | 5 | 379 | +37 | −3 |
| Example 3 | A1 | 100 | B1 | 30 | C3: Calcium gluconate monohydrate | 5 | 369 | +27 | −13 |
| Example 4 | A1 | 100 | B1 | 30 | C4: Zinc oxide | 5 | 366 | +24 | −16 |
| Example 5 | A1 | 100 | B1 | 30 | C5: Calcium oleate | 1 | 361 | +19 | −21 |
| Example 6 | A1 | 100 | B1 | 30 | C6: Magnesium oxide | 5 | 361 | +19 | −21 |
| Example 7 | A1 | 100 | B1 | 30 | C7: Calcium stearate | 1 | 354 | +12 | −28 |

(Note)
A1: Polyvinylidene fluoride resin [KF (trademark) #850, product of KUREHA CORPORATION]
B1: Titanium oxide [TI-PURE (trademark) R101, product of Du Pont Co.]
C1: Calcium carbonate (SL-1500, product of TAKEHARA KAGAKU KOGYO CO., LTD.)
C2: Calcium hydroxide (guaranteed reagent, product of Junsei Chemical Co., Ltd.)
C3: Calcium gluconate monohydrate (guaranteed reagent, product of KANTO CHEMICAL CO., INC.).
C4: Zinc oxide (fine zinc oxide, product of SAKAI CHEMICAL INDUSTRY CO., LTD.)
C5: Calcium oleate (extra pure reagent, product of KANTO CHEMICAL CO., INC.)
C6: Magnesium oxide (guaranteed reagent, product of KANTO CHEMICAL CO., INC.)
C7: Calcium stearate (extra pure reagent, product of KANTO CHEMICAL CO., INC.)

Comparative Examples 5 to 16

Pellets were prepared in the same manner as in Example 1 except that compounds shown in Table 3 were respectively used in their corresponding proportions shown in Table 3 in place of calcium carbonate as the heat stabilizer, thereby measuring temperatures at 10%-weight loss on heating of the respective samples. The results are shown in Table 3.

TABLE 3

| | Composition | | | | | | Temperature at 10%-weight loss on heating | | |
| --- | --- | --- | --- | --- | --- | --- | --- | --- | --- |
| | PVDF resin | | Titanium oxide | | Additive | | | Difference (° C.) | Difference (° C.) |
| | Kind | Part(s) | Kind | Part(s) | Kind | Part(s) | $T_2$ (° C.) | $T_2 - T_1$ | $T_2 - T_0$ |
| Ref. Ex. 1 | A1 | 100 | — | — | — | — | 382 ($T_0$) | — | 0 |
| Comp. Ex. 1 | A1 | 100 | B1 | 30 | — | — | 342 ($T_1$) | 0 | −40 ($T_1 - T_0$) |
| Comp. Ex. 5 | A1 | 100 | B1 | 30 | C8: Silicon oxide | 5 | 344 | +2 | −38 |
| Comp. Ex. 6 | A1 | 100 | B1 | 30 | C9: Molybdenum disulfide | 5 | 342 | 0 | −40 |

TABLE 3-continued

| | Composition | | | | | | Temperature at 10%-weight loss on heating | | |
|---|---|---|---|---|---|---|---|---|---|
| | PVDF resin | | Titanium oxide | | Additive | | | Difference (° C.) | Difference (° C.) |
| | Kind | Part(s) | Kind | Part(s) | Kind | Part(s) | $T_2$ (° C.) | $T_2 - T_1$ | $T_2 - T_0$ |
| Comp. Ex. 7 | A1 | 100 | B1 | 30 | C10: Zirconium tetrachloride | 5 | 341 | −1 | −41 |
| Comp. Ex. 8 | A1 | 100 | B1 | 30 | C11: Calcium chloride | 5 | 340 | −2 | −42 |
| Comp. Ex. 9 | A1 | 100 | B1 | 30 | C12: Calcium acetate monohydrate | 5 | 339 | −3 | −43 |
| Comp. Ex. 10 | A1 | 100 | B1 | 30 | C13: Aluminum oxide | 5 | 335 | −7 | −47 |
| Comp. Ex. 11 | A1 | 100 | B1 | 30 | C14: Iron(III) oxide | 5 | 335 | −7 | −47 |
| Comp. Ex. 12 | A1 | 100 | B1 | 30 | C15: Zirconium oxide | 5 | 335 | −7 | −47 |
| Comp. Ex. 13 | A1 | 100 | B1 | 30 | C16: Magnesium hydroxide | 5 | 331 | −11 | −51 |
| Comp. Ex. 14 | A1 | 100 | B1 | 30 | C17: Stearic acid | 2 | 329 | −13 | −53 |
| Comp. Ex. 15 | A1 | 100 | B1 | 30 | C18: Aluminum oxide (ultrafine particles) | 5 | 329 | −13 | −53 |
| Comp. Ex. 16 | A1 | 100 | B1 | 30 | C19: Iron chloride | 5 | 365 (*1) | +23 | −17 |

(Note)
A1: Polyvinylidene fluoride resin [KF (trademark) #850, product of KUREHA CORPORATION]
B1: Titanium oxide [TI-PURE (trademark) R101, product of Du Pont Co.]
C8: Silicon oxide (AEROSIL RX-200, product of Nippon Aerosil Co., Ltd.)
C9: Molybdenum disulfide (extra pure reagent, product of Wako Pure Chemical Industries, Ltd.)
C10: Zirconium tetrachloride (reagent, product of Wako Pure Chemical Industries, Ltd.)
C11: Calcium chloride (guaranteed reagent, product of KANTO CHEMICAL CO., INC.)
C12: Calcium acetate monohydrate (guaranteed reagent, product of KANTO CHEMICAL CO., INC.)
C13: Aluminum oxide (guaranteed reagent, product of KANTO CHEMICAL CO., INC.)
C14: Iron(III) oxide (reagent, product of Wako Pure Chemical Industries, Ltd.)
C15: Zirconium oxide (reagent, product of Wako Pure Chemical Industries, Ltd.)
C16: Magnesium hydroxide (N-6, product of Konoshima Chemical Co., Ltd.)
C17: Stearic acid (extra pure reagent, product of KANTO CHEMICAL CO., INC.)
C18: Aluminum oxide (ultrafine particles) (ground product of Hosokawa Micron Corporation)
C19: Iron chloride (reagent, product of Wako Pure Chemical Industries, Ltd.)
(*1) The temperature at 10%-weight loss on heating of the PVDF resin composition containing iron chloride is widely improved. However, the surface of a film formed with this PVDF resin composition is not closely integrated and is in a ragged state, and so such a film is evaluated as poor appearance.

Example 8

An operation was conducted in the same manner as in Example 1 except that the polyvinylidene fluoride resin was changed from KF (trademark) #850 (product of KUREHA CORPORATION; suspension polymerization product) to KYNAR (trademark) 720 (product of Arkema Co.; emulsion polymerization product). The result is shown in Table 4.

TABLE 4

| | Composition | | | | | | Temperature at 10%-weight loss on heating | | |
|---|---|---|---|---|---|---|---|---|---|
| | PVDF resin | | Titanium oxide | | Additive | | | Difference (° C.) | Difference (° C.) |
| | Kind | Part(s) | Kind | Part(s) | Kind | Part(s) | $T_2$ (° C.) | $T_2 - T_1$ | $T_2 - T_0$ |
| Ref. Ex. 2 | A2 | 100 | — | — | — | — | 385 ($T_0$) | — | 0 |
| Comp. Ex. 2 | A2 | 100 | B1 | 30 | — | — | 342 ($T_1$) | 0 | −43 ($T_1 - T_0$) |
| Example 8 | A2 | 100 | B1 | 30 | C1: Calcium carbonate | 5 | 376 | +34 | −9 |

(Note)
A2: Polyvinylidene fluoride resin [KYNAR (trademark) 720, product of Arkema Co.; emulsion polymerization product]
B1: Titanium oxide [TI-PURE (trademark) R101, product of Du Pont Co.]
C1: Calcium carbonate (SL-1500, product of TAKEHARA KAGAKU KOGYO CO., LTD.)

Example 9

An operation was conducted in the same manner as in Example 1 except that the titanium oxide was changed from TI-PURE (trademark) R101 (product of Du Pont Co.) to TI-PURE (trademark) R105 (product of Du Pont Co.). The result is shown in Table 5.

TABLE 5

| | Composition | | | | | | Temperature at 10%-weight loss on heating | | |
|---|---|---|---|---|---|---|---|---|---|
| | PVDF resin | | Titanium oxide | | Additive | | | Difference (° C.) | Difference (° C.) |
| | Kind | Part(s) | Kind | Part(s) | Kind | Part(s) | $T_2$ (° C.) | $T_2 - T_1$ | $T_2 - T_0$ |
| Ref. Ex. 1 | A1 | 100 | — | — | — | — | 382 ($T_0$) | — | 0 |
| Comp. Ex. 3 | A1 | 100 | B2 | 30 | — | — | 336 ($T_1$) | 0 | −46 ($T_1 - T_0$) |
| Example 9 | A1 | 100 | B2 | 30 | C1: Calcium carbonate | 5 | 359 | +23 | −23 |

(Note)
A1: Polyvinylidene fluoride resin [KF (trademark) #850, product of KUREHA CORPORATION]
B2: Titanium oxide [TI-PURE (trademark) R105, product of Du Pont Co.]
C1: Calcium carbonate (SL-1500, product of TAKEHARA KAGAKU KOGYO CO., LTD.)

<Consideration>

As apparent from the results of the comparison experiments shown in Tables 2 to 5, the PVDF resin compositions (Examples 1 to 9) respectively containing the particular compounds as the heat stabilizer are increased in the temperature at 10%-weight loss on heating by all of at least 10° C. compared with the PVDF resin compositions (Comparative Examples 1 to 3) containing the PVDF resin and titanium oxide, and it was thus proved that such compositions are excellent in the inhibiting effect on the thermal decomposition.

When calcium carbonate, calcium hydroxide, calcium gluconate, zinc oxide, calcium oleate and magnesium oxide are respectively used (Examples 1 to 6, 8, and 9) as the heat stabilizer, the temperature at 10%-weight loss on heating is increased by all of at least 15° C. When calcium carbonate, calcium hydroxide, calcium gluconate and zinc oxide are respectively used (Examples 1 to 4, 8, and 9) as the heat stabilizer, the temperature at 10%-weight loss on heating is increased by all of at least 20° C. The PVDF resin compositions (Examples 1 to 9) according to the present invention exhibit lowering of the temperature at 10%-weight loss on heating of generally at most 30° C., preferably at most 25° C. compared with the case (Referential Examples 1 and 2) of the PVDF resin alone.

On the other hand, when the compounds that do not belong to the particular heat stabilizers used in the present invention are respectively added (Comparative Examples 5 to 15), the inhibiting effect on the thermal decomposition becomes little, or the tendency to more lower the temperature at 10%-weight loss on heating is rather shown. When iron chloride is added (Comparative Example 16), the temperature at 10%-weight loss on heating is increased by all of 23° C. However, a film formed from this PVDF resin composition lacks surface closability, and its appearance is extremely poor. Thus, the film is of no value as a product.

Figure 2:
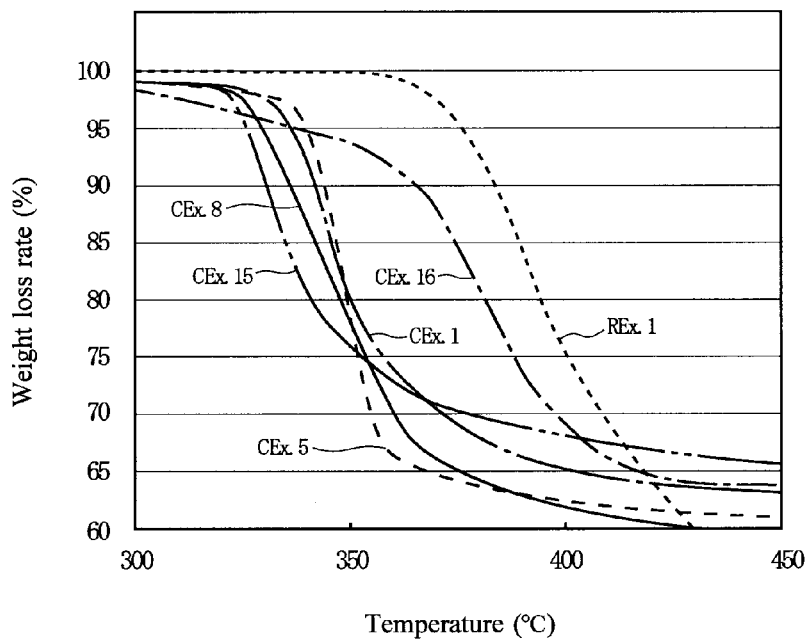
FIG. 2 is a graph illustrating the results of thermogravimetric measurements of respective PVDF resin compositions prepared in Referential Example 1 (REx. 1), Comparative Example 1 (CEx. 1), Comparative Example 5 (CEx. 5), Comparative Example 8 (CEx. 8), and Comparative Examples 15 and 16 (CEx. 15 and CEx. 16) according to the thermogravimetric analysis (TGA).
Figure 3:
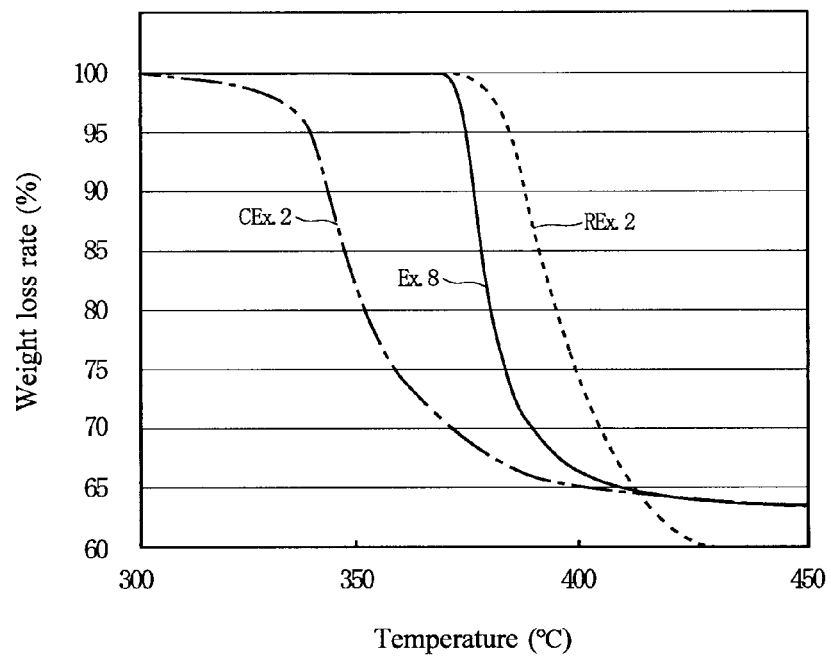
FIG. 3 is another graph illustrating the results of thermogravimetric measurements of respective PVDF resin compositions prepared in Referential Example 2 (REx. 2), Example 8 (Ex. 8) and Comparative Example 2 (CEx. 2) according to the thermogravimetric analysis (TGA).
Figure 4:
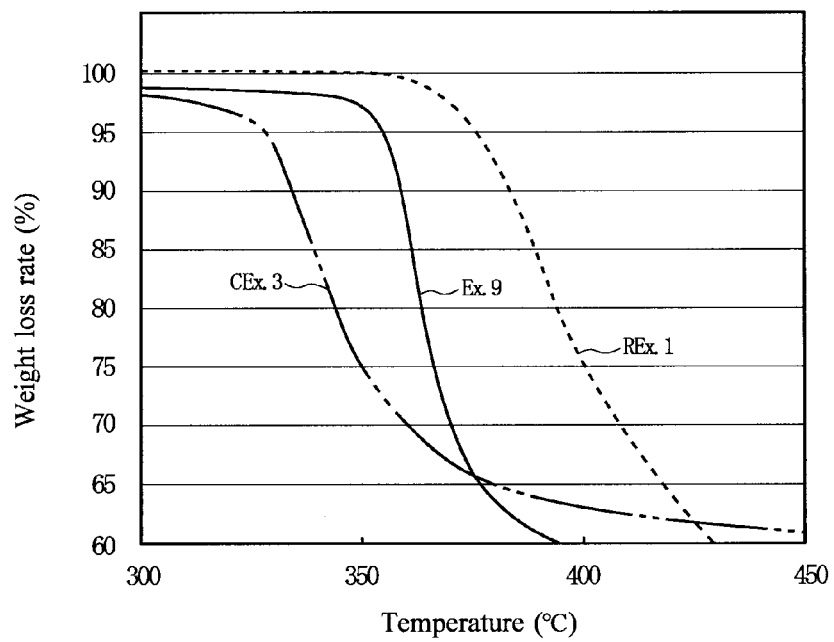
FIG. 4 is a graph illustrating the results of thermogravimetric measurements of respective PVDF resin compositions prepared in Referential Example 1 (REx. 1), Example 9 (Ex. 9) and Comparative Example 2 (CEx. 3) according to the thermogravimetric analysis (TGA).

A graph obtained by conducting thermogravimetric measurements on the samples of Referential Example 1, Comparative Example 1, and Examples 1 to 7 according to the thermogravimetric analysis (TGA) is illustrated in FIG. 1. A graph obtained by conducting thermogravimetric measurements on the samples of Referential Example 1, and Comparative Examples 1, 5, 8, 15 and 16 according to TGA is illustrated in FIG. 2. A graph obtained by conducting thermogravimetric measurements on the samples of Referential Example 2, Comparative Example 2 and Example 8 according to TGA is illustrated in FIG. 3. A graph obtained by conducting thermogravimetric measurements on the samples of Referential Example 1, Comparative Example 3 and Example 9 according to TGA is illustrated in FIG. 4.

Example 10

Figure 5:
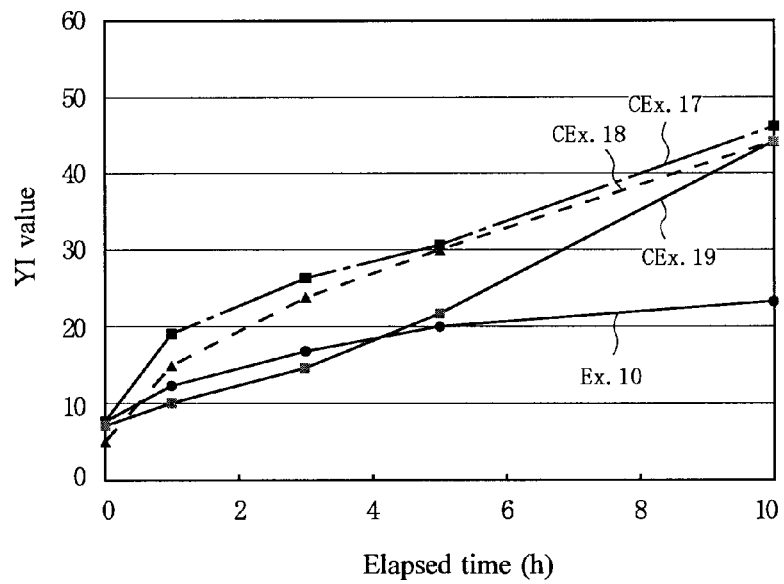
FIG. 5 is a graph illustrating the relationship between an elapsed time and a YI value in a heating test of respective white resin films prepared in Example 10 (Ex. 10), and Examples 17 to 19 (CEx. 17 to CEx. 19).
Figure 6:
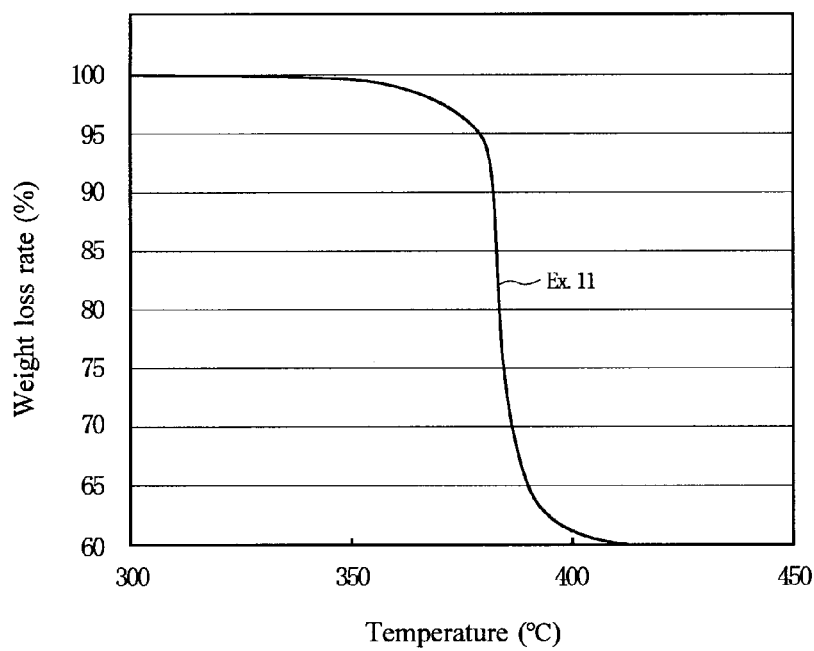
FIG. 6 is a graph illustrating the result of thermogravimetric measurement of a PVDF resin composition prepared in Example 11 (Ex. 11) according to the thermogravimetric analysis (TGA).

The pellets (resin composition containing the PVDF resin, titanium oxide and calcium carbonate) prepared in Example 1 were fed to a single-screw extruder (manufactured by PLA GIKEN CO., LTD.) and melt-extruded at a resin temperature of 240° C. from a T-die having a lip clearance of 1 mm, and the extrudate was cooled by a cooling roll of 90° C. to prepare a resin film having a thickness of 30 μm. This resin film was placed in a thermostatic chamber held at a temperature of 250° C. to determine the relationship between an elapsed time and a YI value. The result is shown in FIG. 5.

Comparative Example 17

A resin film was prepared in the same manner as in Example 10 except that the pellets (resin composition containing the PVDF resin and titanium oxide) prepared in Comparative Example 1 were used in place of the pellets prepared in Example 1 to determine the relationship between an elapsed time and a YI value. The result is shown in FIG. 5.

Comparative Example 18

A resin film was prepared in the same manner as in Example 10 except that the pellets (resin composition containing the PVDF resin, titanium oxide and magnesium hydroxide) prepared in Comparative Example 13 were used in place of the pellets prepared in Example 1 to determine the relationship between an elapsed time and a YI value. The result is shown in FIG. 5.

Comparative Example 19

A resin film was prepared in the same manner as in Example 10 except that the pellets (resin composition containing the PVDF resin, titanium oxide and PMMA) prepared in Comparative Example 4 were used in place of the pellets prepared in Example 1 to determine the relationship between an elapsed time and a YI value. The result is shown in FIG. 5.

<Consideration>

As apparent from the results shown in FIG. 5, the white resin film (Example 10) prepared with the PVDF resin composition according to the present invention keeps its YI value a low level even after 10 hours have elapsed when its change with time has been observed by a heating test at 250° C.

On the other hand, it is understood that the white resin film (Comparative Example 17) with titanium oxide (R101) contained in the PVDF resin, the white resin film (Comparative Example 18) with titanium oxide and magnesium hydroxide contained in the PVDF resin and the white resin film (Comparative Example 19) with the titanium oxide and PMMA contained in the PVDF resin are rapid in the tendency to increase the YI value with time.

Example 11

One hundred parts by weight of a polyvinylidene fluoride resin [KF (trademark) #850, product of KUREHA CORPORATION], 55.6 parts by weight of titanium oxide [TI-PURE (trademark) R101, product of Du Pont Co.; rutile-type titanium oxide, average particle diameter: 0.29 μm, surface-treated product], 2.8 parts by weight of calcium carbonate (SL-1500, product of TAKEHARA KAGAKU KOGYO CO., LTD.), 0.9 parts by weight of calcium stearate (extra pure reagent, product of KANTO CHEMICAL CO., INC.), 23.4 parts by weight of polymethyl methacrylate (PMMA) [DELPOWDER (trademark) 70H, product of ASAHI KASEI CHEMICALS CORPORATION], 2.5 parts by weight of an acrylic elastomer [PALALOID (trademark) EXL-2315, product of Dow Chemical Co.] and 0.04 parts by weight of carbon black [DENKA BLACK (trademark), product of Denki Kagaku Kogyo Kabushiki Kaisha] were fed to a single-screw extruder, melted and kneaded at a cylinder temperature of 220° C. and melt-extruded in the form of strand from a die, and the resultant strand was cut in cold water to prepare pellets. These pellets were used to measure a temperature at 10%-weight loss on heating. As a result, the temperature was 382° C.

A difference between the temperature (382° C.) at 10%-weight loss on heating of this sample in Example 11 and the temperature (382° C.) at 10%-weight loss on heating of the sample in Reference Example 1 was substantially 0° C. As described above, it is understood that even when a large amount of titanium oxide is contained in the PVDF resin, the lowering of the temperature at 10%-weight loss on heating is scarcely observed by causing calcium carbonate and calcium stearate to be contained as the heat stabilizer. A weight ratio of titanium oxide to the heat stabilizers (total amount of calcium carbonate and calcium stearate) in the PVDF resin composition of Example 11 was 15:1.

INDUSTRIAL APPLICABILITY

The PVDF resin compositions according to the present invention can be utilized as raw material of white resin films. The white resin films according to the present invention can be utilized as backsheets for solar cell module.

The invention claimed is:

1. A polyvinylidene fluoride resin composition comprising a polyvinylidene fluoride resin and titanium oxide, wherein
   (a) the content of the titanium oxide is within a range of 10 to 100 parts by weight per 100 parts by weight of the polyvinylidene fluoride resin,
   (b) the polyvinylidene fluoride resin composition contains, as a heat stabilizer, at least one compound selected from the group consisting of calcium polyhydroxymonocarboxylates, calcium salts of aliphatic carboxylic acids having 5 to 30 carbon atoms, calcium carbonate, calcium hydroxide, zinc oxide and magnesium oxide,
   (c) the content of the heat stabilizer is within a range of 0.1 to 20 parts by weight per 100 parts by weight of the polyvinylidene fluoride resin,
   (d) a weight ratio of the titanium oxide to the heat stabilizer is within a range of 100:1 to 3:1,
   (e) the titanium oxide is surface treated with a surface treatment agent, and
   (f) the average primary particle diameter of the titanium oxide is within a range of 150 to 1,000 nm.

2. The polyvinylidene fluoride resin composition according to claim 1, wherein the polyvinylidene fluoride resin is at least one crystalline resin selected from the group consisting of a vinylidene fluoride homopolymer and vinylidene fluoride copolymers, and wherein the crystalline resin has a crystal structure of α type, β type, γ type, or αρ type.

3. The polyvinylidene fluoride resin composition according to claim 2, wherein the vinylidene fluoride copolymers are at least one vinylidene fluoride copolymer selected from the group consisting of vinylidene fluoride-hexafluoropropylene copolymers, vinylidene fluoride-tetrafluoroethylene copolymers, vinylidene fluoride-chlorotrifluoroethylene copolymers, vinylidene fluoride-trifluoroethylene copolymers, vinylidene fluoride-tetrafluoroethylene-hexafluoropropylene terpolymers and vinylidene fluoride-chlorotrifluoroethylene-hexafluoropropylene terpolymers, the copolymerization ratios of the comonomer(s) of which are each 15 mol % or lower.

4. The polyvinylidene fluoride resin composition according to claim 1, wherein the polyvinylidene fluoride resin is at least one selected from the group consisting of a vinylidene fluoride homopolymer and vinylidene fluoride-hexafluoropropylene copolymers containing a hexafluoropropylene unit in a proportion of 15 mol % or lower.

5. The polyvinylidene fluoride resin composition according to claim 1, wherein the titanium oxide is titanium oxide having a rutile-type crystal form.

6. The polyvinylidene fluoride resin composition according to claim 1, wherein the calcium polyhydroxymonocarboxylates are the calcium salt of at least one polyhydroxymonocarboxylic acid selected from the group consisting of glyceric acid, 2,3-diphospho-D-glyceric acid, 9,10-dihydroxyoctadecanoic acid and gluconic acid.

7. The polyvinylidene fluoride resin composition according to claim 1, wherein the calcium salts of aliphatic carboxylic acids having 5 to 30 carbon atoms are the calcium salt of at least one aliphatic carboxylic acid selected from the group consisting of saturated aliphatic monocarboxylic acids having 5 to 30 carbon atoms and unsaturated aliphatic monocarboxylic acids having 5 to 30 carbon atoms.

8. The polyvinylidene fluoride resin composition according to claim 1, wherein the calcium salts of aliphatic carboxylic acids having 5 to 30 carbon atoms are the calcium salts of saturated fatty acids having 10 to 30 carbon atoms, the calcium salts of unsaturated fatty acids having 11 to 30 carbon atoms or mixtures thereof.

9. The polyvinylidene fluoride resin composition according to claim 1, wherein the heat stabilizer is at least one selected from the group consisting of calcium gluconate, calcium carbonate, calcium hydroxide, calcium oleate, calcium stearate, zinc oxide and magnesium oxide.

10. The polyvinylidene fluoride resin composition according to claim 1, wherein the heat stabilizer has an average primary particle diameter within a range of 0.05 to 2 μm as measured according to the image analysis of an image taken by a transmission electron microscope.

11. The polyvinylidene fluoride resin composition according to claim 1, which further comprises at least one of other additives selected from the group consisting of a pigment dispersant, an ultraviolet absorbent, a light stabilizer, a delustering agent, a lubricant, a tint adjustor, a crystal nucleating agent and an elastomer, independently of one another, in a proportion of 10 parts by weight or lower per 100 parts by weight of the polyvinylidene fluoride resin.

12. The polyvinylidene fluoride resin composition according to claim 1, which further comprises polymethyl methacrylate in a proportion of 30 parts by weight or lower per 100 parts by weight of the polyvinylidene fluoride resin.

13. The polyvinylidene fluoride resin composition according to claim 1, wherein another thermoplastic resin is polymethyl methacrylate.

14. A white resin film formed from a polyvinylidene fluoride resin composition containing a polyvinylidene fluoride resin and titanium oxide, wherein
   (i) the content of the titanium oxide is within a range of 10 to 100 parts by weight per 100 parts by weight of the polyvinylidene fluoride resin,
   (ii) the polyvinylidene fluoride resin composition contains, as a heat stabilizer, at least one compound selected from the group consisting of calcium polyhydroxymonocarboxylates, calcium salts of aliphatic carboxylic acids having 5 to 30 carbon atoms, calcium carbonate, calcium hydroxide, zinc oxide and magnesium oxide,
   (iii) the content of the heat stabilizer is within a range of 0.1 to 20 parts by weight per 100 parts by weight of the polyvinylidene fluoride resin,
   (iv) a weight ratio of the titanium oxide to the heat stabilizer is within a range of 100:1 to 3:1,
   (v) the titanium oxide is surface treated with a surface treatment agent, and
   (vi) the average primary particle diameter of the titanium oxide is within a range of 150 to 1,000 nm.

15. A backsheet for solar cell module, comprising a layer formed of the white resin film according to claim 14.

16. A multi-layer film, comprising a layer formed of the white resin film according to claim 14.

17. The polyvinylidene fluoride resin composition according to claim 1, wherein the content of the titanium oxide is within a range of 15 to 100 parts by weight per 100 parts by weight of the polyvinylidene fluoride resin.

18. The polyvinylidene fluoride resin composition according to claim 1, wherein the content of the titanium oxide is within a range of 20 to 60 parts by weight per 100 parts by weight of the polyvinylidene fluoride resin.

19. The polyvinylidene fluoride resin composition according to claim 1, wherein the surface treatment agent comprises an oxide of aluminum, silicon, zirconium, tin, cerium or bismuth; a hydrated metal oxide of zinc; an organic aluminum compound, organic titanium compound or organic zirconium compound; an organic silicon compound; an aluminum phosphate or organic phosphate; or an amine compound.

* * * * *